(12) United States Patent
Wong et al.

(10) Patent No.: US 6,621,320 B2
(45) Date of Patent: Sep. 16, 2003

(54) VCC INDEPENDENT TIME DELAY CIRCUIT

(75) Inventors: Waisum Wong, El Dorado Hills, CA (US); Chaitanya Rajguru, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/821,586

(22) Filed: Mar. 28, 2001

(65) Prior Publication Data

US 2002/0140482 A1 Oct. 3, 2002

(51) Int. Cl.$^7$ ................................................ H03H 11/26
(52) U.S. Cl. ........................ 327/262; 327/276; 327/288; 326/34
(58) Field of Search ................................ 327/261–264, 327/276–278, 284, 285, 288, 291, 362, 513; 326/32–34; 365/194; 438/299–303, 269; 257/328

(56) References Cited

U.S. PATENT DOCUMENTS

| | | | | |
|---|---|---|---|---|
| 4,578,600 A | * | 3/1986 | Magee | 326/34 |
| 4,945,262 A | * | 7/1990 | Piasecki | 326/68 |
| 5,051,630 A | * | 9/1991 | Kogan et al. | 327/262 |
| 5,453,709 A | * | 9/1995 | Tanimoto et al. | 327/276 |
| 5,748,542 A | * | 5/1998 | Zheng et al. | 365/194 |
| 5,786,255 A | * | 7/1998 | Yeh et al. | 438/299 |
| 6,041,089 A | * | 3/2000 | Yokomizo | 375/371 |
| 6,184,090 B1 | * | 2/2001 | Lin | 438/269 |

\* cited by examiner

*Primary Examiner*—Timothy P. Callahan
*Assistant Examiner*—Minh Nguyen
(74) *Attorney, Agent, or Firm*—Blakely, Sokoloff, Taylor & Zafman LLP

(57) ABSTRACT

A time delay circuit including a first transistor having a gate, a drain, a source, and a channel between the source and the drain. The input voltage is applied between the gate and drain and the output is taken between the source and drain. The output voltage follows the gate voltage, and the first transistor gate voltage is substantially constant. The time delay circuit also includes a delay element. The output voltage of the first transistor biases the delay element.

8 Claims, 5 Drawing Sheets

VCC INDEPENDENT TIME DELAY CIRCUIT

FIELD OF THE INVENTION

The present invention relates to logic circuits and more specifically to time delay logic circuits and oscillators.

BACKGROUND OF THE INVENTION

There are many types of prior art time delay circuits. Often, time delay circuits included an analog time delay such as a resistive-capacitive (RC) circuit. An RC circuit receives a pulse and then delays or extends that pulse according to an RC time constant of the RC circuit. FIG. 1 shows a RC time delay circuit 100. A short pulse 102 is received in the input terminal 104 through a gating circuit 106. The gating circuit applies the input pulse to the input of the RC tank circuit 108. The RC tank circuit includes resistor 109 and capacitor 110. An extended pulse 120 is output from the RC tank circuit through an output gate 130. The extended pulse is extended according to the RC time constant of the tank circuit. The RC time delay circuit 100 has several shortfalls. One shortfall is that it is extremely dependent upon temperature and the corresponding variation of the resistance and the capacitance of the resistor 109 and capacitor 110, respectively. The dependence on temperature results in an extremely variable time delay. Another Shortfall of the RC time delay is that the RC time constant is also dependent upon the applied voltage, Vcc. Because the output of the RC time delay circuit is variable, then it is not precisely predictable or reliable unless the temperature of the resistor 109 and the capacitor 110 is also known. If the temperature of the resistor 109 and the capacitor 110 is also known, then the resulting time delay can be correlated to temperature and thereby predicted. Unfortunately, monitoring the temperature of R1 and C1 requires a more complicated circuit.

A resistive circuit can also be used in a bias current controlled oscillator 200 as shown in FIG. 2. Resistor 202 and transistor M1 set up a bias current for transistors M2 and M3. Transistors M2 and M3 create reference voltages $REF_P$ and $REF_N$, respectively. $REF_P$ and $REF_N$ are input to an oscillator 210 that includes biasing transistors M4, M5, and three oscillator stages 212, 214, 216. Additional stages could also be included but the illustration is limited to the three stages for simplicity of discussion. The first oscillator stage 212 includes transistors M6, M7. The second oscillator stage 214 includes transistors M8, M9. The third oscillator stage 216 includes transistors M10, M11. Reference voltages $REF_P$ and $REF_N$ are used to bias the three stages 212, 214, 216 of the oscillator 210. Each of the stages 212, 214, 216 are delay inverters. The input to the stages 212, 214, 216 are linked to the output of the stages to create an oscillator. The oscillation frequency of the bias current controlled oscillator 200 is dependent upon the voltage drop across the biasing resistor 202. The voltage drop across the resistor 202 varies with the temperature of the resistor 202 or the current flow through the resistor 202. The oscillation frequency of the bias current controlled oscillator 200 is also dependent on variations in the Vcc input voltage. Further, the bias current controlled oscillator 200 also sinks a static current through the resistor 202 and the first stage 212, even when the oscillator is not oscillating.

For one embodiment of the invention, a time delay circuit comprises a first transistor and a delay element. An input voltage is applied between the gate and the drain of the first transistor. An output voltage is taken at the source of the first transistor. The output voltage of the first transistor is coupled to the delay element, biasing the delay element.

BRIEF DESCRIPTION OF THE DRAWINGS

The present invention is illustrated by way of example and not limitation in the figures of the accompanying drawings in which like references indicate similar elements.

DETAILED DESCRIPTION

As will be described in more detail below, one embodiment includes a time delay circuit including a first transistor having a gate, a drain, a source, and a channel between the source and the drain. The input voltage is applied between the gate and drain and the output is taken between the source and drain. The output voltage follows the gate voltage, and the first transistor gate voltage is substantially constant. The time delay element also includes a delay element, wherein the delay element is coupled to the first transistor such that the output voltage of the first transistor biases the delay element.

There are two major causes of timing variations in time delay circuits. One cause is the variation in the input voltage. Variations in the input voltage vary the device performance characteristics such as impedance and switching speed and therefore the timing in a time delay circuit. Even small variations in the input voltage can cause timing shifts. The second major cause of variation in timing circuits is the effect of temperature on the device performance characteristics such as impedance and switching speed and therefore the timing in a time delay circuit. Even small variations in the temperatures of the devices can cause timing shifts. Many devices require precise timing such as microprocessors, memory buffers, counters. Because device speeds are ever increasing, the requirement for precise timing becomes ever more important. One embodiment isolates the timing circuits from variations in the supply voltage. Another embodiment reduces the effects of temperatures on the devices.

Figure 1:
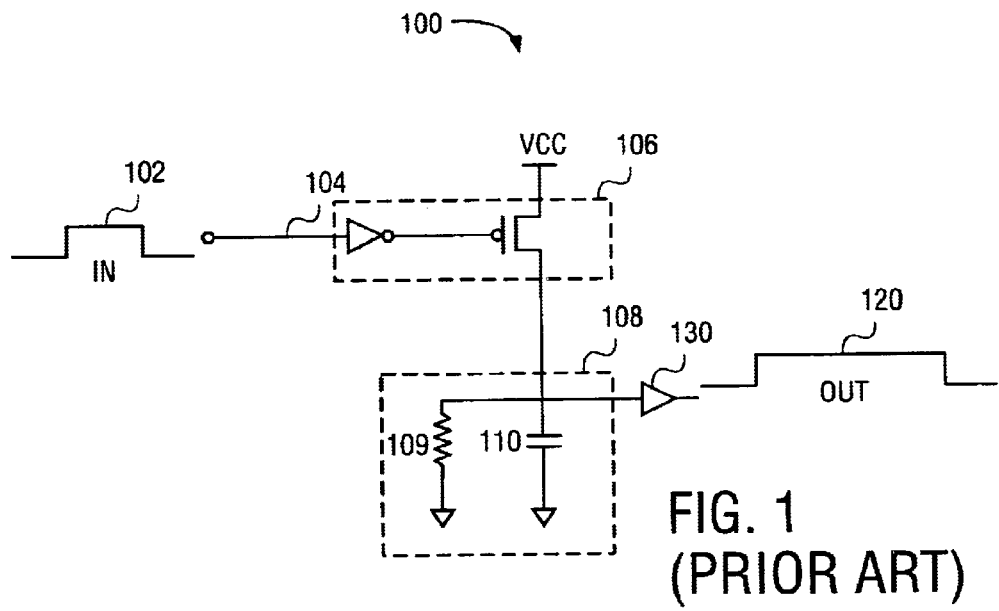
FIG. 1 shows an RC time delay circuit.
Figure 2:
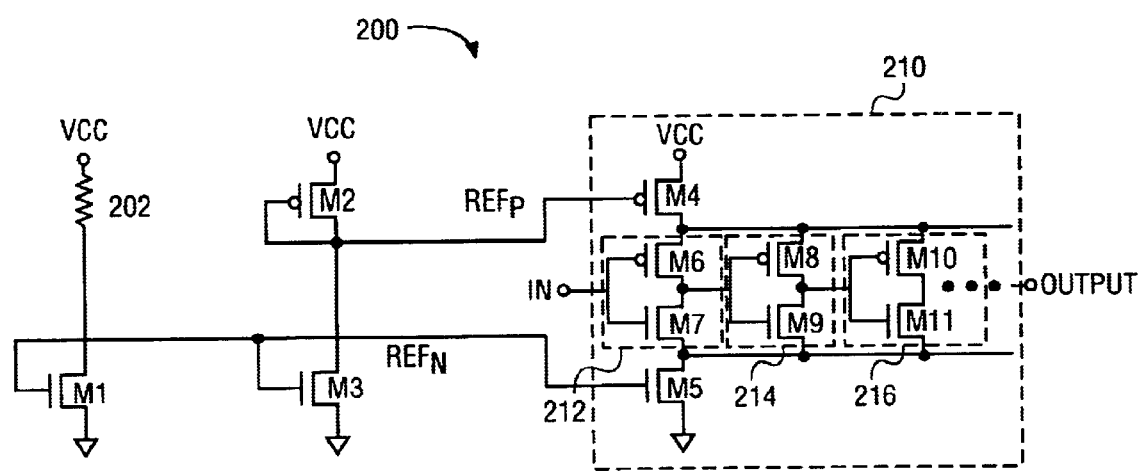
FIG. 2 shows a bias current controlled oscillator.
Figure 3:
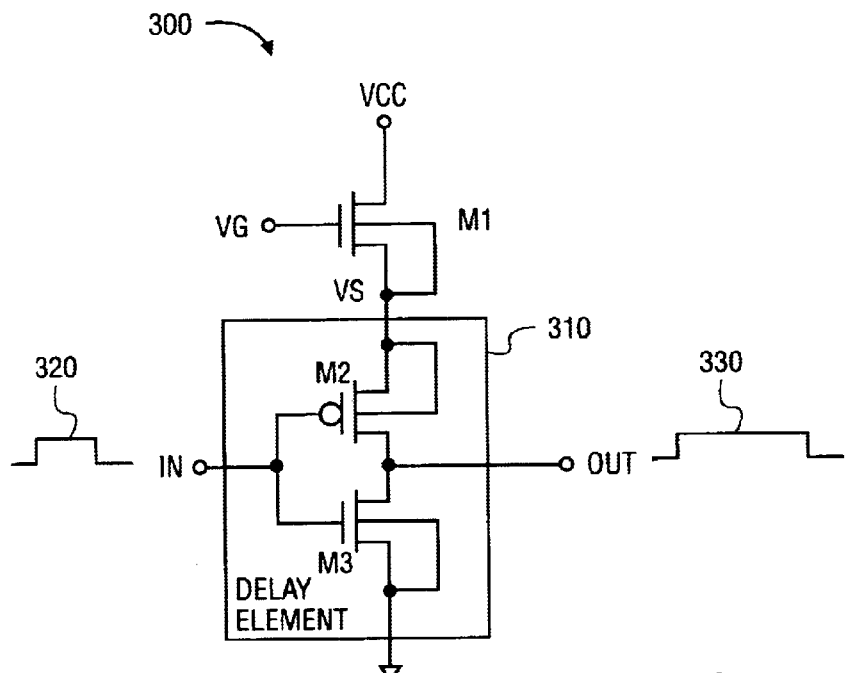
FIG. 3 shows one embodiment of a time delay circuit.

FIG. 3 shows one embodiment of a time delay circuit 300. The time delay circuit 300 includes a transistor M1 connected as a source follower (i.e. where the input signal is applied between gate and drain with output taken between source and drain). The output voltage VS of M1 is applied to the delay element 310 as a biasing voltage. Delay element 310 includes an inverter circuit that includes transistors M2 and M3. Transistors M2 and M3 delay the input signal 320 according to the time constant of the inverter element 310. The biasing voltage VS is input to the delay element 310 and determines the time constant of the delay element 310. The resulting inverted output signal 330 includes a time delay in that the output pulse is longer than the input pulse.

The transistor M1 isolates delay element 310 from Vcc. By isolating Vcc, transistor M1 substantially eliminates or rejects any variation in Vcc. Eliminating variation in Vcc is especially important in a circuit where performance must be consistent over a range of operating conditions. Vcc is connected to a power supply (not shown) that varies, for example, between 2.7 and 3.6 volts. Gate voltage VG generated from another circuit (not shown) and is a substantially constant voltage of, for example, two volts. For one embodiment, VG is may or may not be sufficiently high to bias M1 to saturation.

The output voltage VS of M1 is approximately equal to VG less the threshold voltage VT of M1. VS follows VG, therefore VS is independent of any variations of Vcc. The substantial rejection of Vcc variations by transistor M1 allows the timing in subsequent devices such as delay element 310 to not be effected by variations in Vcc. VG must be limited to a very small, or zero variation or VS will vary. VG can be any tightly controlled reference voltage, i.e. very stable voltage. For alternative embodiments the polarities and corresponding P and N materials of the different transistors M1 and M2, M3 could be reversed.

For one embodiment, transistor M1 is a low threshold voltage (low VT)/low body effect, N-channel transistor and transistors M2, M3 are regular, P-channel and N-channel transistors. The body effect (e.g., back gate bias effect) occurs in an MOSFET transistor when the body is at a different potential than the source/drain such that a reverse biased junction is formed between the source/drain and the body (i.e., substrate) of the transistor. The reversed biased PN junctions cause a depletion region to form around the associated drain or the source. For example, as the substrate or body (e.g., p-type silicon) of an NMOS transistor is made more negative relative to the source or drain (e.g., n-type silicon) of the transistor, the depletion region between the substrate and the source/drain experiences a larger potential drop and thus becomes thicker. Accordingly, in order to turn on the transistor, a higher voltage must be applied at the gate of the NMOS transistor to overcome the larger depletion region. The net result of the body effect is the apparent increase in the effective threshold voltage of the NMOS transistor as the reverse bias between the substrate and the source or drain is increased. Similarly, the effective threshold voltage of a PMOS transistor will increase if its body (e.g., n-type silicon) is at a higher potential than its source or drain (e.g., p-type silicon). A low VT/low body effect transistor has a significantly reduced body effect over a typical MOSFET transistor. Low VT/low body effect transistors are well known in the art and are created by doping the semiconductor portions of the transistor so that the threshold voltage and the body effect are reduced.

Figure 4:
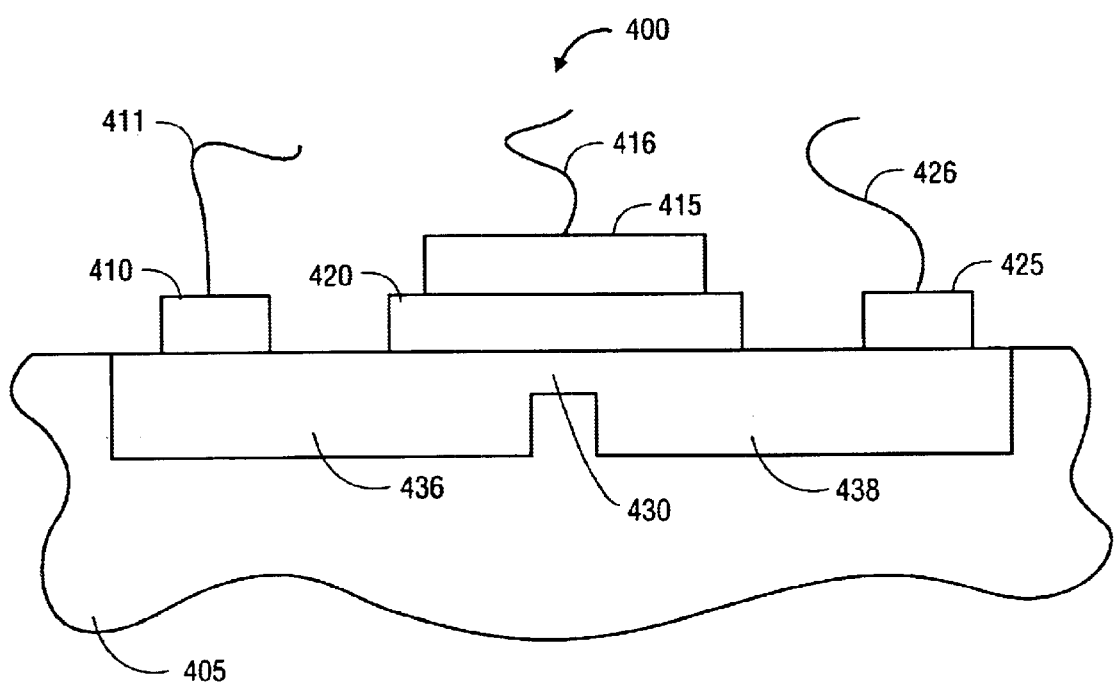
FIG. 4 shows one embodiment of a MOSFET transistor with a minimized channel length.

FIG. 4 shows one embodiment of a MOSFET transistor 400 with an optimized channel length. The transistor includes a substrate 405, source contact 410 and source lead 411, gate contact 415 with gate lead 416 and gate insulator 420. A drain 425 and drain lead 426 are also shown. Alternatively, if the substrate 405 is N-type material, then P-type regions 436, 438 are shown. The channel 430 is also shown. The channel 430 is smaller than the length of the minimum line width items such as the source 410 and drain 425. The specific length of the channel 430 can be selected to minimize the gate delay temperature coefficient of the transistor 400. For one embodiment of the circuit shown in FIG. 3, transistors M1, M2 and M3 have the length of the channel 430 is optimized to substantially reduce or minimize the gate delay temperature coefficient of the transistors M1, M2, and M3. For more embodiments, the gate delay temperature coefficient is reduced as much as 50% or more as compared to transistors having larger channel lengths. The reduction in the gate delay temperature coefficient is attributed to insensitivity of carrier velocity to the temperature change when the transistor operates in the saturated region. Therefore, for one embodiment, VG is set high enough to bias M1 into saturation. Alternatively, M1 must be a low body effect transistor if VG is not high enough to drive M1 into saturation.

For one embodiment the length of the channel 430 of the MOSFET is optimized to the minimum length possible by the state of the art semiconductor device manufacturing processes. For example, currently the smallest semiconductor device line widths are between 0.12 micron and 0.08 micron. Future semiconductor device production capabilities will be less than 0.08 micron and even smaller. The channel in a MOSFET is produced by diffusion and therefore the channel can be considerably smaller than even the minimum line widths of 0.08 micron and smaller. In typical state of the art transistors, the channel 430 length is not specifically limited to a particular dimension but is determined primarily by the size of the items such as the regions 436, 438, and the gate contact 415 that surround the channel 430.

Figure 5:
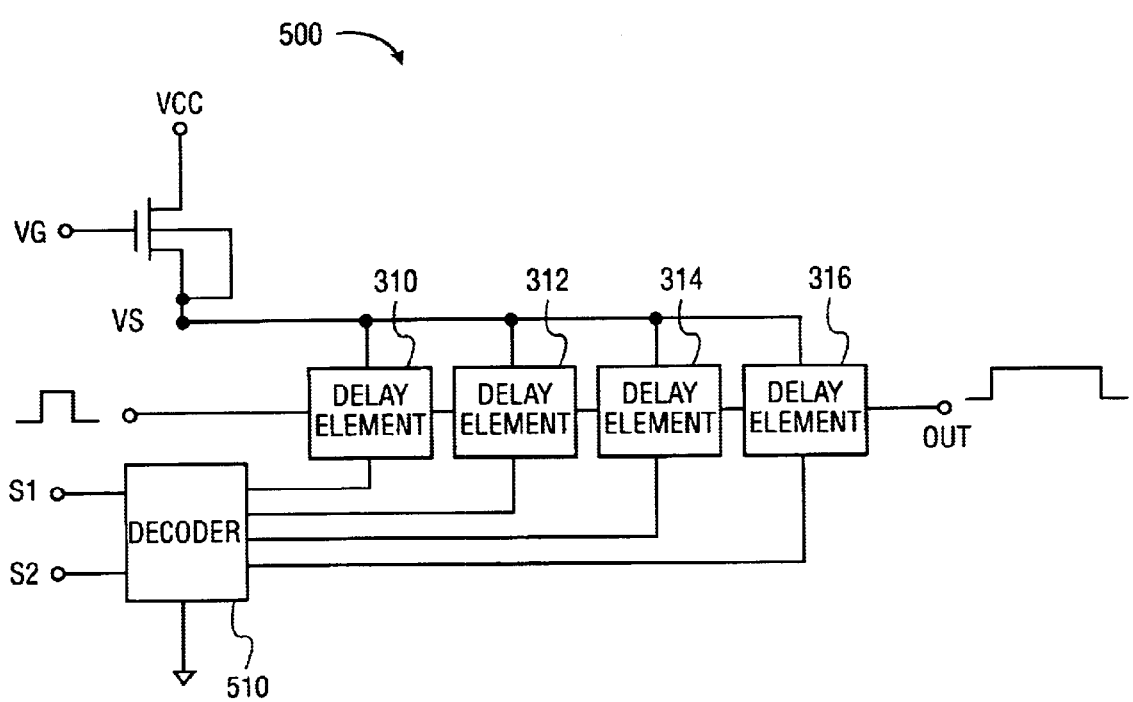
FIG. 5 illustrates an improved, time sensitive, pulse generator circuit.

FIG. 5 illustrates an improved, time sensitive, pulse generator circuit 500. M1 isolates a series delay elements 310, 312, 314, 316 from variations in Vcc as described above. Each one of the series of delay elements 310, 312, 314, 316 are similar to the delay element 310 described in FIG. 3 above. A decoder 510 selects the desired time delay according to the input signals received at S1 and S2. The desired time delay is selected by enabling the corresponding number of delay elements.

The delay element 310 and Vcc isolator M1 can be used in any type of a clock circuit or other timing circuit such as a counter, a micro-processor or a memory buffer. The constant VS provides a much more constant and predictable time delay and therefore the time delay element 310 can be used for much more accurate system timing. In the time sensitive, pulse generator circuit 500, a number of stages of delay elements 310, 312, 314, 316 are used. Each delay element adds a precise delay because the variations are substantially reduced. The time sensitive, pulse generator circuit 500 provides a very precise time delay that can be very tightly controlled and very predictable for a very tightly controlled system, such as a microprocessor.

One major advantage of this circuit is the substantial elimination of any variations in the timing or switching speed because the source voltage VS is more constant and the circuit 500 is isolated from any variations in Vcc.

For one embodiment, the time sensitive, pulse generator circuit 500 includes low VT/low body effect transistor M1, as described above. For another embodiment, the variations in timing/switching caused by the temperature of the circuit are substantially eliminated by optimizing the length of the channels of the transistors M1 and the transistors in each of the delay elements 310, 312, 314, 316 similar to M2, M3 as described above. The optimized channel length further eliminates any timing/switching variations resulting from changes in temperature, i.e. the effect of the temperature coefficient of the circuit is minimized.

Figure 6:
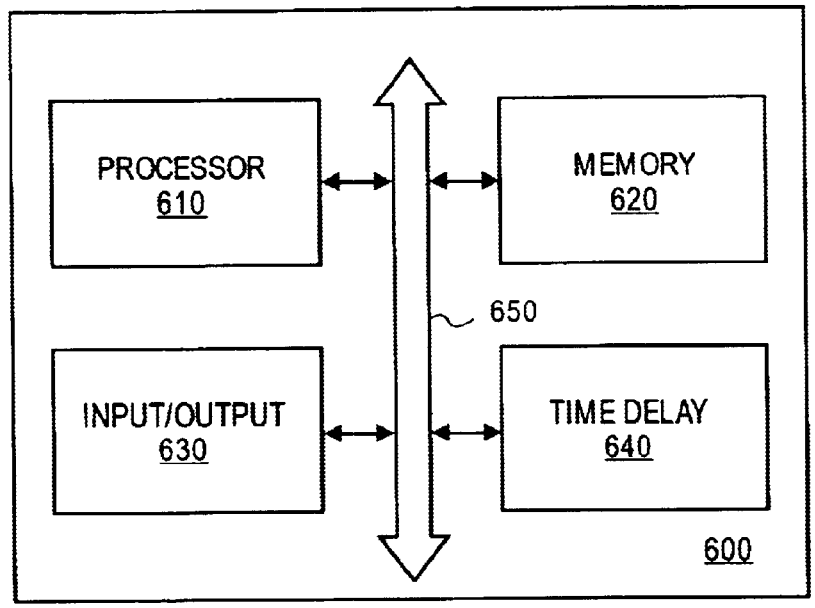
FIG. 6 illustrates a computer system of one embodiment.
Figure 6A:
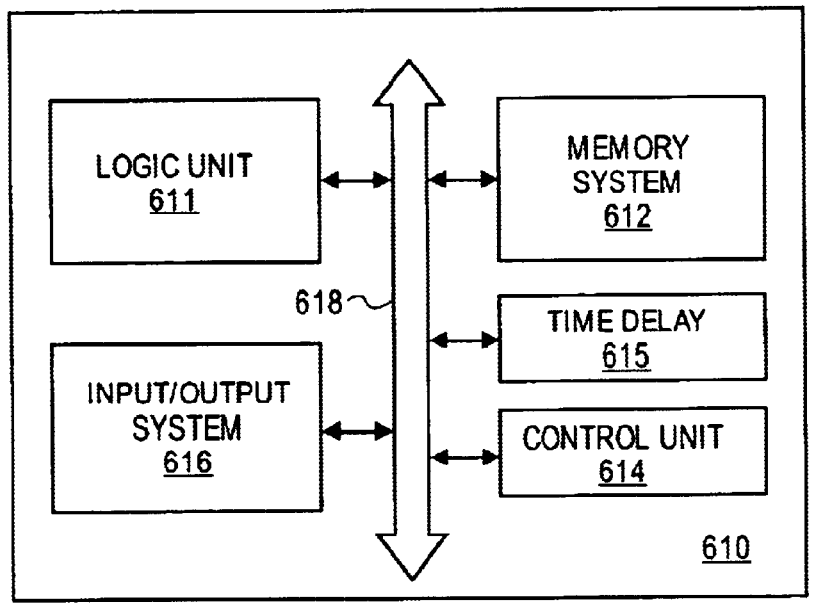
FIG. 6A illustrates a microprocessor of one embodiment.

FIG. 6 illustrates a computer system 600 of one embodiment. The computer system 600 includes a processor 610, system input and output systems 630, a memory system 620 and a time delay 640 such as described above. The components of the computer system are coupled together via a system bus 650. FIG. 6A illustrates a microprocessor 610 of one embodiment. The microprocessor includes a logic unit 611, a memory system 612, a control unit 614, processor input and output systems 616 and a time delay 640 such as described above. The components of the microprocessor are coupled together via a processor system bus 618.

Figure 7:
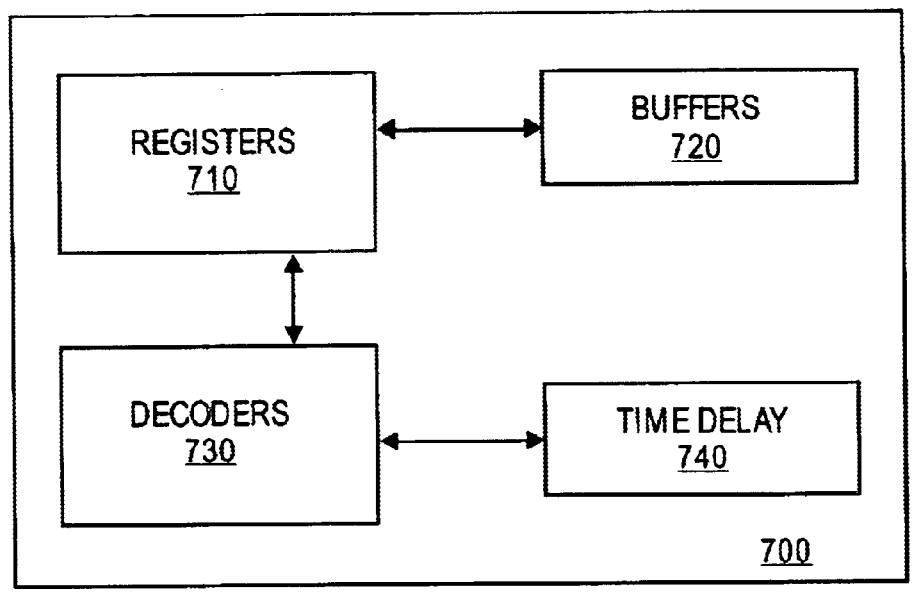
FIG. 7 illustrates a memory system of one embodiment.

FIG. 7 illustrates a memory system 700 of one embodiment. The memory system 700 includes one or more registers 710 and one or more buffers 720 and one or more decoders 730. The memory system 700 can also include a time delay 740 circuit as described above. The memory system components are also coupled together.

Figure 8:
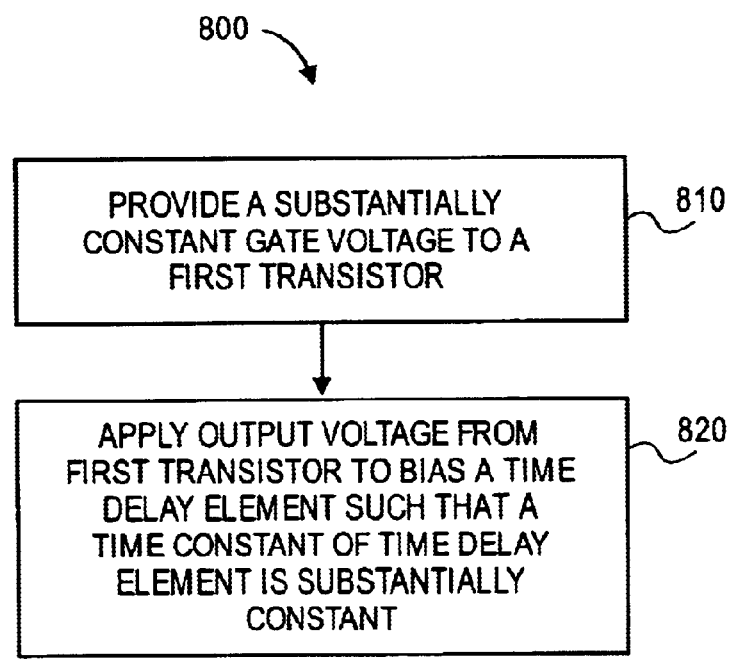
FIG. 8 shows a method of one embodiment.

FIG. 8 describes a time delay method 800 of one embodiment. First a substantially constant voltage is applied to the gate of a source follower transistor. The output voltage is then applied to a time delay element. Because the time constant of the time delay element is related to the input voltage, then the time constant is substantially constant. For alternate embodiments, the time constant can also remain substantially constant over a range of temperatures if the transistors in the time delay element have an optimized channel length and/or if the source follower transistor is operated in a saturation mode.

In the foregoing specification, the invention has been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A time delay circuit comprising:
   a first transistor having a gate, a drain, a source, and a channel between the source and the drain, wherein an input voltage is applied to the gate, wherein the first transistor gate voltage is substantially constant, wherein an output voltage is the first transistor source voltage;
   a delay element, wherein the delay element is coupled to the first transistor such that the output voltage of the first transistor biases the delay element; and
   a decoder, wherein the decoder is coupled to the delay element, wherein the decoder enables the delay element.

2. The time delay circuit of claim 1, wherein the first transistor is a low threshold voltage/low body effect transistor, wherein the low threshold voltage/low body effect transistor helps to prevent the formation of a reverse biased junction between the source/drain and the substrate of the first transistor.

3. A time delay circuit of claim 1, wherein the delay element comprises:
   a second transistor; and
   a third transistor.

4. The time delay circuit of claim 3, wherein the line width of the third transistor is less than 0.12 micron.

5. The time delay circuit of claim 3, wherein the line width of the second transistor is less than 0.12 micron.

6. The time delay circuit of claim 3, wherein the first transistor has a channel length of less than 0.12 micron.

7. An apparatus comprising:
   means for isolating an input voltage to m time delay circuits to reduce timing variations, wherein m is an integer greater than or equal to one; and
   means for selecting a time delay by enabling n time delay circuits, wherein n is an integer less than or equal to m.

8. The apparatus of claim 7, further comprising:
   means for reducing temperature variations of the m time delay circuits to reduce timing variations.

* * * * *